(12) United States Patent
Horan et al.

(10) Patent No.: US 6,462,623 B1
(45) Date of Patent: Oct. 8, 2002

(54) METHOD AND APPARATUS FOR PLL WITH IMPROVED JITTER PERFORMANCE

(75) Inventors: John M. Horan, Little Island; John G. Ryan, Rochestown; Mark M. Smyth, Co Waterford; David J. Foley, Ferbane, all of (IE)

(73) Assignee: Parthus Ireland Limited, Dublin (IE)

(*) Notice: Subject to any disclaimer, the term of this patent is extended or adjusted under 35 U.S.C. 154(b) by 0 days.

(21) Appl. No.: 09/574,683

(22) Filed: May 17, 2000

Related U.S. Application Data

(60) Provisional application No. 60/134,960, filed on May 19, 1999.

(51) Int. Cl.[7] .............. H03B 5/02; H03L 7/093; H03L 7/099; H03H 11/26

(52) U.S. Cl. .............. 331/17; 331/25; 331/34; 331/57; 331/177 R; 327/270; 327/272; 327/288; 327/290

(58) Field of Search .............. 331/17, 25, 34, 331/57, 177 R; 327/270, 272, 281, 283, 288, 290

(56) References Cited

U.S. PATENT DOCUMENTS

| | | | |
|---|---|---|---|
| 4,875,195 A | | 10/1989 | Momodomi et al. |
| 5,640,126 A | * | 6/1997 | Mellot .............. 331/17 |
| 5,691,669 A | * | 11/1997 | Tsai et al. .............. 331/17 |
| 5,854,575 A | | 12/1998 | Fiedler et al. |
| 5,949,289 A | * | 9/1999 | Smith et al. .............. 331/8 |
| 5,952,891 A | | 9/1999 | Boudry |

OTHER PUBLICATIONS

D.A. Johns, K. Martin, "Analog Integrated Circuit Design", New York: Wiley, 1997, p. 246–248.
Gardner, F.M., "Charge–Pump Phase–Lock Loops," IEEE Transactions on Communications, vol. COM–28, No. 11, Nov. 1980.
Ware, K.M., et al., "A 200–MHz CMOS Phase–Locked Loop with Dual Phase Detectors," IEEE Journal of Solid-State Circuits, vol. 24, No. 6, Dec. 1989.
Young, I.A., et al., "A PLL Clock Generator with 5 to 110 MHz of Lock Range for Microprocessors," IEEE Journal of Solid–State Circuits, vol. 27, No. 11, Nov. 1992.

* cited by examiner

Primary Examiner—David Mis
(74) Attorney, Agent, or Firm—Blakely, Sokoloff, Taylor & Zafman LLP

(57) ABSTRACT

An apparatus is described comprising a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input. Another apparatus is described comprising an oscillator having a high gain input and a low gain input. The oscillator comprises a series of inverters where each inverter output is coupled to the next inverter input in the series. At least one of the inverters comprises a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input. Yet another apparatus is described comprising an oscillator having a high gain input and a low gain input. The oscillator comprises a series of inverters, each inverter output is coupled to the next inverter input in the series. The low gain input is coupled to less than all of the inverters within the series.

47 Claims, 11 Drawing Sheets

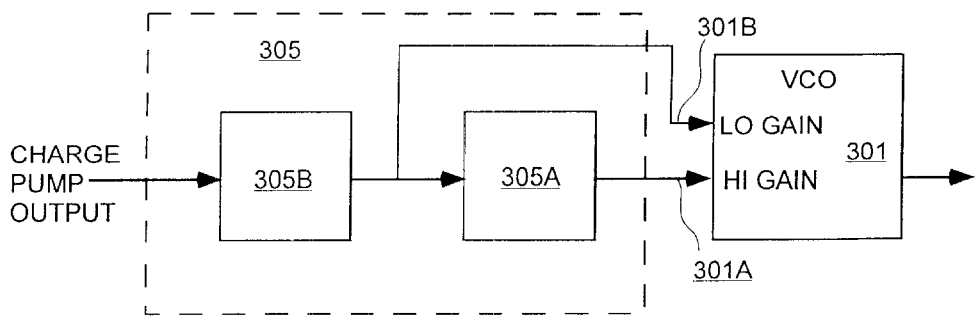
FIG. 3A
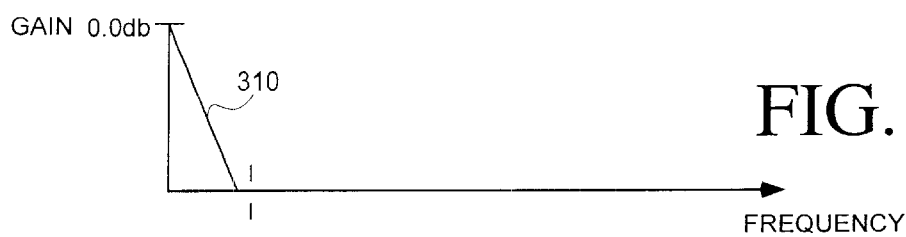
FIG. 3B
FIG. 3C
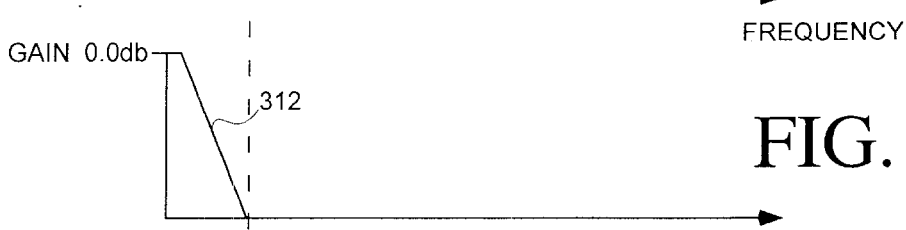
FIG. 3D
FIG. 3E

METHOD AND APPARATUS FOR PLL WITH IMPROVED JITTER PERFORMANCE

The present application hereby claims the benefit of the filing date of a related Provisional Application entitled "VOLTAGE CONTROLLED OSCILLATOR (VCO) GAIN REDUCTION METHOD FOR A COMPLETELY ON-CHIP PHASE LOCKED LOOP (PLL)", filed May 19, 1999, and assigned application Ser. No. 60/134,960.

FIELD OF THE INVENTION

The field of the invention relates to Phase Lock Loop (PLL) design and; more specifically, to reducing jitter in the output of a voltage controlled oscillator.

BACKGROUND

Phase Lock Loop (PLL) designs are commonly used to synchronize the output of an oscillator with a reference clock. Synchronization means a reference clock (Ref_Clock) signal and an oscillator output (Ref_Clock×N) signal operate at a fixed frequency and phase relationship. The oscillator output appears as a multiple ("N") of the reference clock having a frequency of N·fo (where fo is the frequency of the reference clock).

FIG. 1 shows a general approach. In FIG. 1, the oscillator 101 is a voltage controlled oscillator (VCO) that produces a signal output having a frequency proportional to the voltage placed at its input 101a. The frequency of the oscillator 101 is downconverted in the feedback loop by the downconverter 102. The downconverter 102 is typically a counter that triggers an edge at its output signal only after "N" edges are observed in the VCO 101 output. Downconverter 102 allows the VCO 101 to operate at a higher frequency than the reference clock (Ref_Clock).

Phase comparator 103 produces an output based upon the phase difference between the downconverter 102 output signal and the reference clock. In the particular approach shown in FIG. 1, a stream of pulses appear on the "upn" signal if the phase of the downconverter 102 output signal lags behind the reference clock. The width of the pulses within "upn" pulse stream are proportional to the amount of lag that exists. Similarly, a stream of pulses appear on the "down" signal if the phase of the downconverter 102 output signal is ahead of (i.e., "leads") the reference clock. The width of the pulses within the "down" pulse stream are proportional to the amount of lead that exists.

If a pulse stream appears on the "upn" signal, pulses of current are supplied by charge pump 104 to the loop filter 105. This raises the voltage at the VCO 101 input since loop filter 105 acts as an integrator. Raising the voltage at the VCO 101 input increases the frequency of the VCO 101 output signal. Similarly, if a pulse stream appears on the "down" signal, pulses of current are pulled by charge pump 104 from the loop filter 105 which lowers the voltage at the VCO 101 input. Lowering the voltage at the VCO 101 input decreases the frequency of the VCO 101 output signal. Note that loop 101,105 should also have adequate phase margin such that phase detector 103 does not confuse the proper output signaling (e.g., sending a "down" signal when the downconverter 102 output signal actually lags the reference clock).

During an initial synchronization time, the voltage at the VCO 101 input approaches its proper value (i.e., the voltage corresponding to the proper VCO output frequency) as a result of the charge pump's activity. During this time, the charge pump usually supplies and/or pulls current to/from the loop filter 105 linearly with the aforementioned pulse streams. As the voltage at the VCO 101 approaches the proper value, the width of the current pulses from the charge pump 104 narrow. Ideally, when the proper VCO 101 input voltage is eventually reached, the phase detector 103 does not recognize any error and does not submit any pulse streams to the charge pump. At this point, the PLL is stabilized and the voltage at the VCO 101 input remains substantially constant.

Since the dynamic activity of the charge pump 103 in relation to the design of the loop filter 105 determines the proper voltage at the VCO 101 input, the small signal transfer characteristics of the loop filter 105 are of noteworthy concern in PLL applications. For example, in order to increase the frequency at the VCO 101 output for a given reference clock frequency (or, alternatively, to keep the frequency of the VCO constant while reducing the speed of the reference clock), the division factor "N" associated with the downconverter 102 may be increased.

If N is increased to move the VCO output frequency up, the gain of the VCO (given in Hz/volt) should be increased so that the voltage presented by the loop filter 105 may be used to give an even higher output frequency. If N is increased to move the reference clock frequency down while keeping the VCO output frequency the same, the frequencies associated with the current pulses used to pump the loop filter 105 shift more toward 0.0 Hz lower in the spectrum. In either case, the problem arises that the PLL is more susceptible to jitter produced by small fluctuations in the voltage presented at the VCO 101 input. In the former case, the VCO is more sensitive to voltage fluctuations because it has been designed with a higher gain; in the later case the frequencies associated with the current pulse streams are closer to the passband of the filter (resulting in less attenuation of these time varying signals and correspondingly more fluctuation at the VCO 101 input).

SUMMARY OF INVENTION

An apparatus is described comprising a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input. Another apparatus is described comprising an oscillator having a high gain input and a low gain input. The oscillator comprises a series of inverters where each inverter output is coupled to the next inverter input in the series. At least one of the inverters comprises a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input.

Yet another apparatus is described comprising an oscillator having a high gain input and a low gain input. The oscillator comprises a series of inverters, each inverter output is coupled to the next inverter input in the series. The low gain input is coupled to less than all of the inverters within the series.

A phase lock loop is also described comprising an on chip oscillator. An on chip loop filter is coupled to the on chip oscillator. The on chip loop filter comprises only components that are on chip and one of the components is an on chip resistor. An on chip switch is coupled to the on chip resistor. An on chip circuit is coupled to the on chip switch and the on chip circuit is configured to modulate the on chip switch at a duty cycle.

Another apparatus is described comprising an oscillator having a first and second inputs. A first filter has an output coupled to the first oscillator input. A second filter has an output coupled to the second oscillator input and the first filter input. Isolation is coupled between the second filter output and the first filter input.

A method is also described comprising passing a signal representative of the phase difference between two signals through a loop filter. The loop filter has an on chip resistor. A switch placed in series with the on chip resistor is modulated at a duty cycle to increase the effective resistance of the on chip resistor. The output of the loop filter is passed to a voltage controlled oscillator. Another method is described comprising presenting a high gain signal and a low gain signal to a variable load within an inverter. The inverter has a delay that increases with the impedance of the variable load. The variable load impedance is changed in response to the high gain signal. The variable load impedance is changed in response to the low gain signal such that a greater change in impedance is caused by the high gain signal than the low gain signal.

BRIEF DESCRIPTION OF THE DRAWINGS

The present invention is illustrated by way of example, and not limitation, in the Figures of the accompanying drawings in which:

FIG. 3a shows a loop filter split into two channels and a corresponding VCO.

FIG. 3b shows a diagram that represents a transfer function associated with the first loop filter of FIG. 3a.

FIG. 3c shows a charge pump signal associated with an inaccurate VCO frequency.

FIG. 3d shows a diagram that represents a transfer function associated with the second loop filter of FIG. 3a.

FIG. 3e shows a charge pump signal associated with a VCO frequency that is more accurate than the signal associated with FIG. 3c.

FIG. 4a shows a VCO architecture that may be used to implement the VCO of FIG. 3a.

FIG. 4b shows an alternate VCO architecture that may be used to implement the VCO of FIG. 3a.

FIG. 4c shows another alternate VCO architecture that may be used to implement the VCO of FIG. 3a.

FIG. 8 shows a PLL that utilizes a VCO and loop filter in accordance with the techniques associated with FIG. 3a.

FIG. 9 shows a PLL that utilizes a VCO and loop filter in accordance with the techniques associated with FIGS. 2 and 3a.

DETAILED DESCRIPTION

Figure 1:
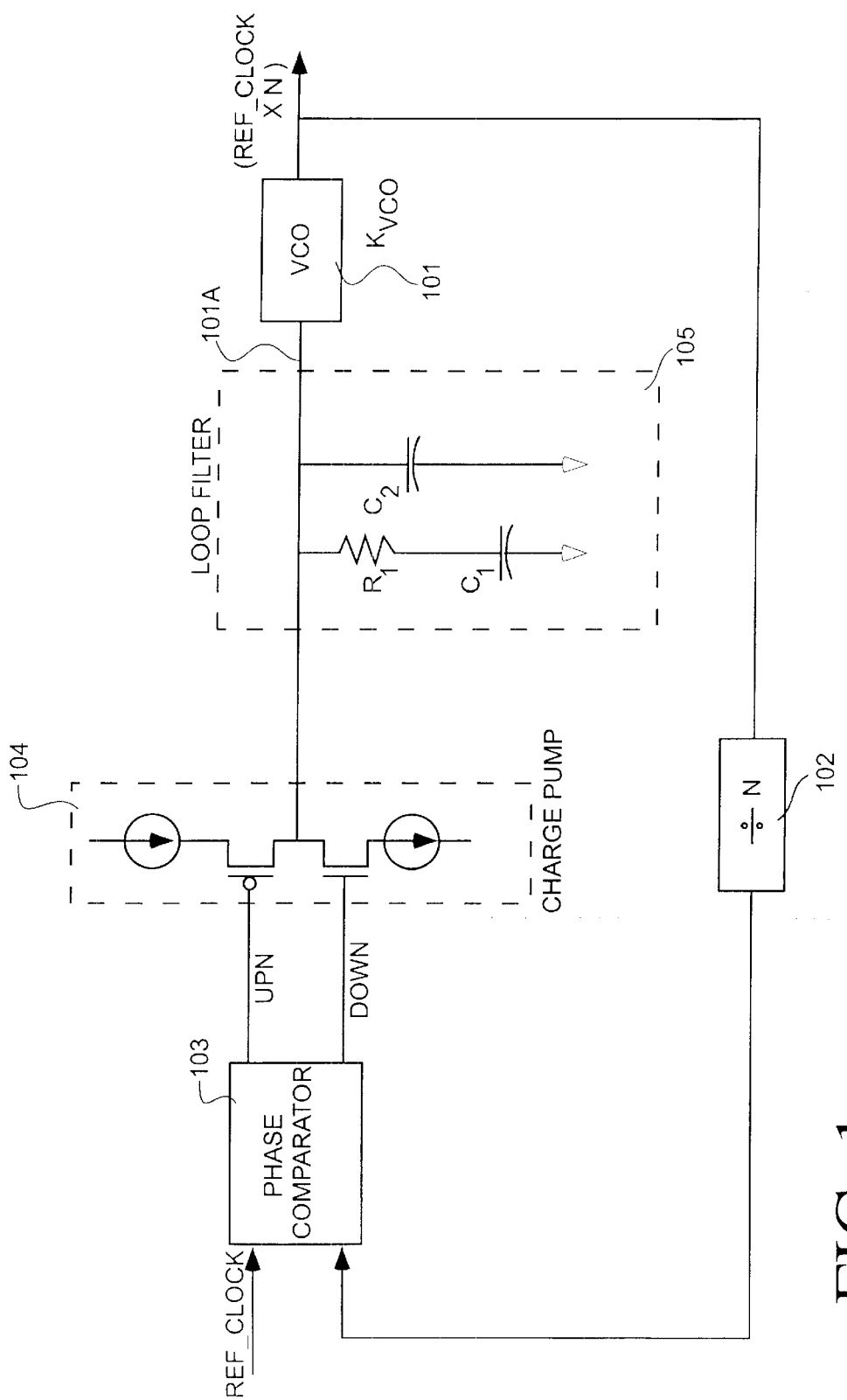
FIG. 1 shows a prior art Phase Lock Loop (PLL).

An apparatus is described comprising a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input. Another apparatus is described comprising an oscillator having a high gain input and a low gain input. The oscillator comprises a series of inverters where each inverter output is coupled to the next inverter input in the series. At least one of the inverters comprises a current source and a pair of transistors coupled to the current source. A pair of variable loads are coupled to the pair of transistors such that a first of the pair of transistors drives a first of the pair of variable loads and a second of the pair of transistors drives a second of the pair of variable loads. Each of the pair of variable loads are coupled to a high gain input and a low gain input.

Yet another apparatus is described comprising an oscillator having a high gain input and a low gain input. The oscillator comprises a series of inverters, each inverter output is coupled to the next inverter input in the series. The low gain input is coupled to less than all of the inverters within the series.

A phase lock loop is also described comprising an on chip oscillator. An on chip loop filter is coupled to the on chip oscillator. The on chip loop filter comprises only components that are on chip and one of the components is an on chip resistor. An on chip switch is coupled to the on chip resistor. An on chip circuit is coupled to the on chip switch and the on chip circuit is configured to modulate the on chip switch at a duty cycle.

Another appratus is described comprising an oscillator having a first and second inputs. A first filter has an output coupled to the first oscillator input. A second filter has an output coupled to the second oscillator input and the first filter input. Isolation is coupled between the second filter output and the first filter input.

A method is also described comprising passing a signal representative of the phase difference between two signals through a loop filter. The loop filter has an on chip resistor. A switch placed in series with the on chip resistor is modulated at a duty cycle to increase the effective resistance of the on chip resistor. The output of the loop filter is passed to a voltage controlled oscillator. Another method is described comprising presenting a high gain signal and a low gain signal to a variable load within an inverter. The inverter has a delay that increases with the impedance of the variable load. The variable load impedance is changed in response to the high gain signal. The variable load impedance is changed in response to the low gain signal such that a greater change in impedance is caused by the high gain signal than the low gain signal.

An approach to the problem described in the background is to lower the bandwidth of the loop filter 105 and/or reduce the sensitivity of the VCO 101 to voltage fluctuations. Both of these are discussed in succession.

Reduction of Loop Bandwidth.

By reducing the loop filter 105 bandwidth, attenuation at frequencies associated with the current pulses is enhanced.

The result is less time variation (i.e., fluctuation) in the voltage at the VCO 101 input. In order to reduce loop bandwidth while maintaining proper phase margin, the zeroes and poles associated with the loop filter should be moved toward a lower frequency. This can be accomplished by: 1) increasing capacitance (e.g., increasing C1 and/or C2); 2) increasing resistance (e.g., increasing resistor R1); or 2) increasing both resistance and capacitance.

Figure 2:
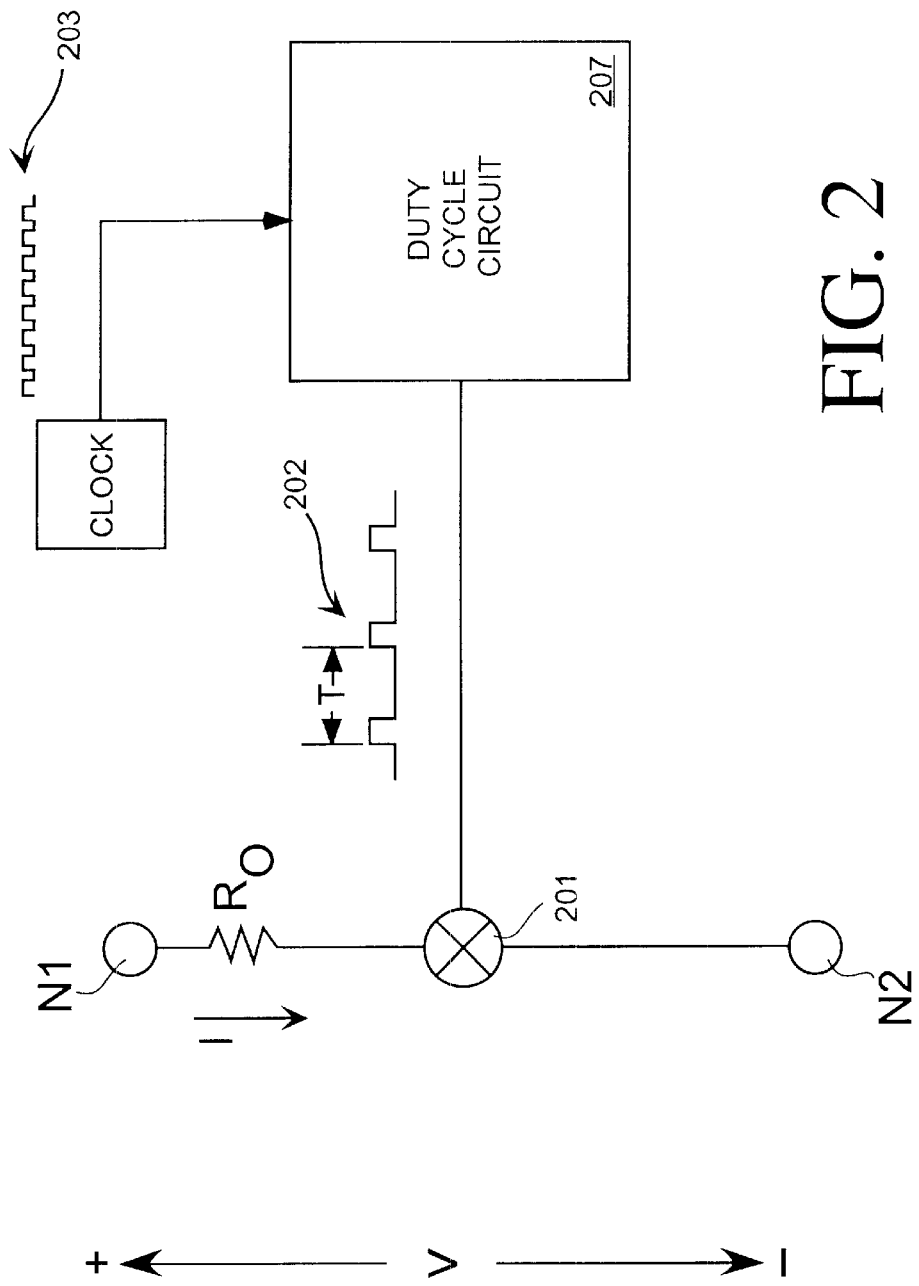
FIG. 2 shows a technique for increasing the effective value of a resistor.

Increasing capacitance and/or resistance, however, can lead to larger physical sizes that necessitate implementing R1, C1 and/or C2 "off chip" rather than "on chip". That is, passive elements associated with the loop filter are not integrated onto the semiconductor chip used to implement the PLL and are instead wired into the PLL through the use of chip input/output leads. For implementations desiring "on chip" loop filter 105 components, FIG. 2 shows a technique that may be used to obtain effectively high resistance values within suitably small physical sizes.

The basic approach is to effectively increase the effective resistance of a particular resistor that is implemented "on chip". The approach uses a small "onchip" resistor which is switched on and off to effectively scale up the resistance. Thus, in FIG. 2, the effective resistance value of resistor Ro is increased as observed from node n1 to node n2.

The effective resistance observed from node n1 to n2 may be given as:

$$\text{Reff} = V/I_{ave} \qquad \text{Eqn. 1}$$

where V is the voltage across nodes n1 and n2 over a time t and $I_{ave}$ is the average current through Ro over the time period t. In the embodiment of FIG. 2, switch 201 is modulated (i.e., opened and closed) consistent with a control signal 202 having an associated duty cycle. As such switch 201 is closed, permitting current flow through resistor Ro, for only a fraction of time t (e.g., the time that a pulse is present on the control signal 202). Thus, for a given voltage V over a time t, I=V/Ro flows through resistor Ro for only a limited amount of time nt (where n is the duty cycle which is equal to the fraction over a time t that switch 201 is closed). From this the average current over the cycle t, $I_{ave}$=nI. Substituting into Equation 1 gives:

$$\text{Reff} = V/(nI) = Ro/n \qquad \text{Eqn. 2}$$

where Ro=V/I.

Thus resistor Ro may effectively behave as a larger resistor consistent with the modulation of switch 201 provided by duty cycle circuit 207. For example, if control signal 202 has a duty cycle of 1:50 where switch 201 is closed for only 1.0 out of every 50.0 pulses associated with a clock signal 203, n=1/50 and Ro is effectively increased by a factor of 50.0. Note that if the raw clock signal 203 is sent to the switch 201, the duty cycle is ½. A transistor may be used for the switch 201 as well as other circuits or devices that can behave as an open or short circuit in light of the control signal 202.

The technique just described may be applied to any resistor technology associated with semiconductor manufacturing technology such as polysilicon resistors or diffused resistors. Furthermore, the technique just described may be tailored for a range of suitable duty cycles and resistor Ro values to produce a wide range of possible effective resistance Reff values.

Note that since higher effective resistance Reff may be obtained with a lower actual resistance Ro, this technique can be used to reduce thermal noise. This feature is helpful in PLL applications since noise produced by the loop filter may be reduced. Lower thermal noise can be taken advantage of not only to reduce voltage fluctuations associated with a VCO input but may also be used in other applications such as prior to any form of amplification or sampling (e.g., for an analog to digital converter).

It is possible that noise introduced from the switching activity of switch 201 may diminish the advantage of reduced thermal noise. Switching noise may be eliminated or reduced, however, by switching the switch 201 at a frequency higher than the frequency of concern for the particular Reff. Alternatively the switching noise may be filtered.

Thus to summarize so far, low bandwidth loop filters may be implemented in many instances without using "off chip" components if the resistors that control poles and/or zeroes may be effectively enhanced by modulating a switch in series with an on chip resistor. Larger resistance values can be used to move the poles or zeroes closer to 0.0 Hz which reduces the bandwidth of the loop (while maintaining appropriate phase margin).

Furthermore, by emphasizing pole and zero adjustment through increased resistance, emphasis on pole/zero adjustment through increased capacitance is eliminated (or reduced) allowing for non increased capacitor values as well. Since such capacitor values are more easily integrated into an "on chip" design, entirely "on chip" loop filters can be constructed. It is important to note, however, that the techniques discussed above may be used in modest or high frequency loop filter designs and are therefore not limited solely to low bandwidth loop applications.

Reducing VCO Sensitivity to Voltage Fluctuations

As discussed, a solution to implementing low jitter PLLs involves designing a VCO that is less sensitive to voltage fluctuations at the VCO input. To first order, sensitivity to voltage fluctuations may be realized by reducing the gain of the VCO. For a given voltage fluctuation, a lower gain VCO will produce less jitter than a higher gain VCO.

However, reducing VCO gain alone may have limitations in a practical environment. Practical applications may desire a wide range of frequencies available at the output of the VCO. For example, consider a VCO application desirable of a frequency range in the hundreds of megahertz (e.g., between 100–500 MHz). If the range on the VCO input voltage is limited to a few volts (e.g., 0.0 to 2.0 v), the corresponding gain will be in the hundreds of Megahertz per volt (e.g., 200 MHz/volt with a center frequency of 300 Mhz at a 1.0 v input).

If the gain of the VCO is limited by an order of magnitude (e.g., 20 MHz/volt) the available range of VCO output frequencies drops from hundreds of megahertz to tens of megahertz (e.g., from 100–500 Mhz to 270–330 Mhz). A narrow VCO output frequency range may not properly satisfy market demands and, as such, additional considerations beyond simple VCO gain reduction should be considered. Furthermore, reducing overall VCO gain tends to work against current trends in silicon technology which are continually leading toward higher frequencies (which promotes wider frequency ranges) and lower supply voltages (which promotes smaller VCO input voltages).

In another approach, wide VCO frequency ranges having reduced sensitivity to voltage fluctuations, may be obtained by splitting the single VCO 101 input of FIG. 1 into more than one input as shown in FIG. 3a. The VCO of FIG. 3a has a high gain input 301a and a low gain input 301b. In various embodiments, the frequency output of the VCO that results from a combination of the signals presented at both inputs 301a,b may be determined as provided in Equation 3 below:

$$f_{VCO} = f_{CO} + A(V_{ina} - V_{oa}) + B(V_{inb} - V_{ob}) \quad \text{Eqn. 3}$$

where: 1) fco is the center frequency of the VCO; 2) Vina and Vinb are the input voltage signals presented at the high and low gain inputs 301a,b respectively; 3) A and B are the higher and lower VCO gains (in Hz/volt), respectively (where A>B); and 4) Voa and Vob are reference voltages between the high gain and low gain input voltage ranges, respectively. Note that in FIG. 3a, the loop filter 305 is modified to produce a pair of outputs for each VCO input 301a,b.

Loop filter 305 may be viewed as having two separate channels: a first channel (formed by the combination of first loop filter 305a and second loop filter 305b) that feeds the VCO high gain input 301a and a second channel 305b (formed by second loop filter 305b) that feeds the VCO low gain input 301b. FIG. 3b shows an exemplary depiction of the transfer function 310 associated with the first loop filter 305a and FIG. 3d shows an exemplary depiction of the transfer function 312 associated with the second loop filter 305b.

Note that the first loop filter 305a has lower bandwidth than the second loop filter 305b. This results in the first channel having lower bandwidth than the second channel and correspondingly better suppression of frequencies above the reference clock frequency fo. The current pulses produced by the charge pump typically have a first harmonic at the reference clock frequency fo. Thus the frequencies over which the loop filter 305 is supposed to integrate and supress are at fo and higher. Note however that for embodiments where the signal used to drive the loop filter 305 posseses frequencies below the reference clock frequency fo, the loop filters 305a,b may be tailored according to this description to suitably supress such frequencies.

The first channel, having lower bandwidth than the second channel, is coupled to the high gain input 301a of the VCO 301. This portion of the PLL acts as a "coarse" adjustment on the VCO output frequency. Typically, during the initial moments of the PLL's synchronization time, the current pulses provided by the charge pump are comparatively wide (reflecting large error between the VCO output and reference clock). Referring to FIG. 3c, which shows an exemplary depiction of the charge pump output signal 311 during this time period, larger signal strength is located at the lower frequencies associated with the current pulse stream. Integration over these lower frequencies allows the VCO to locate an approximate region about where its output frequency should settle. As such, this operation of the PLL may be viewed as a "coarse" adjustment on the VCO's output frequency.

As the VCO output frequency becomes more accurate (due to its response to the initial loop filter integration over the lower frequencies), the current pulse widths from the charge pump begin to narrow resulting in comparatively less signal power at the lower frequencies (than during the initial "large error" time period as shown in FIG. 3c). An exemplary depiction of the charge pump output signal 312 as the VCO output frequency becomes more accurate is shown in FIG. 3e. The second loop filter 305b, having more bandwidth than loop filter 305a, is configured to integrate over higher frequencies since the signal power of the charge pump signal 312 is spread more evenly over a wider spectrum as seen in FIG. 3e. Note that loop filter 305b is coupled to the low gain input 301b of the VCO 301.

By responding to the integration over a wider signal spectrum (which contains higher precision information associated with higher frequencies), the second loop filter 305b and low gain input 301b behave as a "fine" adjustment that allows the PLL to lock onto the reference clock. Since the VCO output frequency has already been placed proximate to the correct frequency by the coarse adjustment, however, the gain associated with the VCO's responsivity to the second loop filter 305b can be lower than the VCO gain at the first filter 305a. That is, at this point, less VCO output frequency range is needed to lock onto the reference clock.

The voltage fluctuations attributed to jitter are mostly associated with the failure of the loop filter to completely reject the signal power of the current pulse stream (at various frequencies) once the VCO output becomes more accurate. That is, since the second loop filter 305b has greater bandwidth than the first loop filter 305a, voltage fluctuations that cause jitter are found predominately at the output of the second loop filter 305b. However, since the second loop filter 305b is coupled to the low gain input 301b of the VCO, the VCO (having reduced gain at this input) is desensitized to these fluctuations and the PLL exhibits reduced jitter.

Figure 4A:
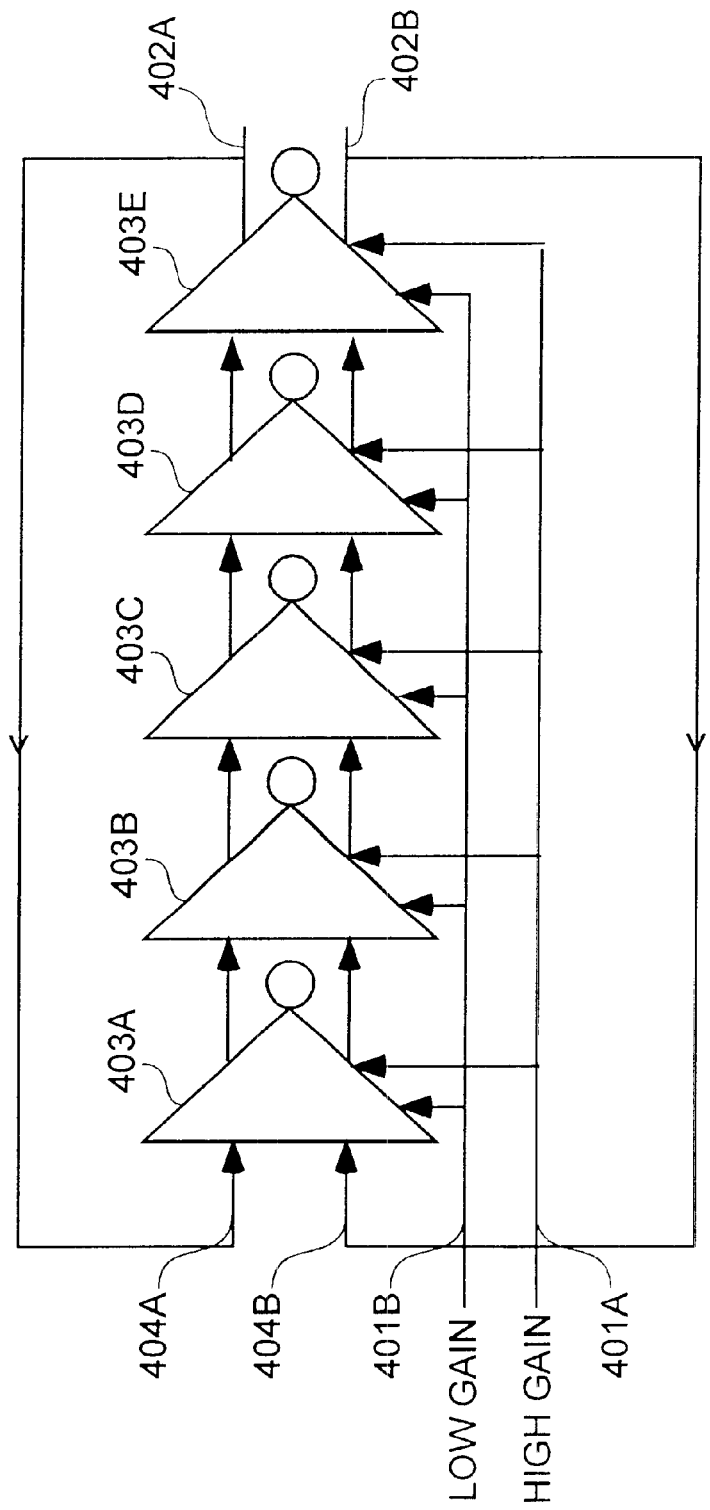

FIG. 4a shows a block diagram of a design that may be used to implement the VCO. The VCO design of FIG. 4a is a Ring Oscillator type that couples a number of inverters (5 in this example) 403a,b,c,d,e in series and in a feedback arrangement. This arrangement is purposely unstable, and causes the output nodes 402a,b to continually flip from low to high and high to low. For example, a high output at output node 402a causes the same output node 402a to eventually flip low. The now low output at this node 402a eventually causes the output 402a to go high. In this manner, the voltage at output 402a oscillates between low and high values.

The frequency of oscillation is a function of the time consumed in rippling the effect of a particular output node voltage through the string of inverter blocks 403a,b,c,d,e. That is, once an output node 402a,b voltage is presented (via feedback) to the input nodes 404a,b of the first inverter block 403a, the effect on the output of the second inverter block 403b will not be noticed until some delay time later. The total delay observed through all inverter blocks 403a,b,c,d,e corresponds to one half the period of the oscillating VCO output signal. The number of inverter blocks and the delay through each inverter block may be tailored for a particular VCO frequency range, thus the invention should not be limited to only five inverters 403a,b,c,d,e as shown in FIG. 4a.

In the VCO approach of FIG. 4a, the delay through each inverter 403a though 403e will be approximately the same if each inverter 403a through 403e is designed the same. An example includes an embodiment where each inverter is designed according to the design of FIG. 5a and each inverter changes resistance according to equations 4a and 4b where the values of Ri1, Rx1, Ri2, Rx2, Voa and Vob are the same for each inverter. In such an approach, for a given inverter design, the delay through the inverter will be the delay through a single inverter multiplied by the number of inverters in the VCO. Note that the circuit of FIG. 5a and equations 4a and 4b are discussed in more detail further ahead.

In alternate embodiments, a VCO may be designed such that at least two inverters have different delay as compared to one another (e.g., by having two inverters with different values for Ri1, Rx1, Ri2, Rx2, Voa and Vob in equations 4a and 4b). Such an approach may enable the designer to more precisely craft the delay through the VCO such that it corresponds to a more preferrable range of output frequencies. Other approaches where at least two inverters have different delay as compared to one another are shown in FIGS. 4b and 4c.

Figure 4B:
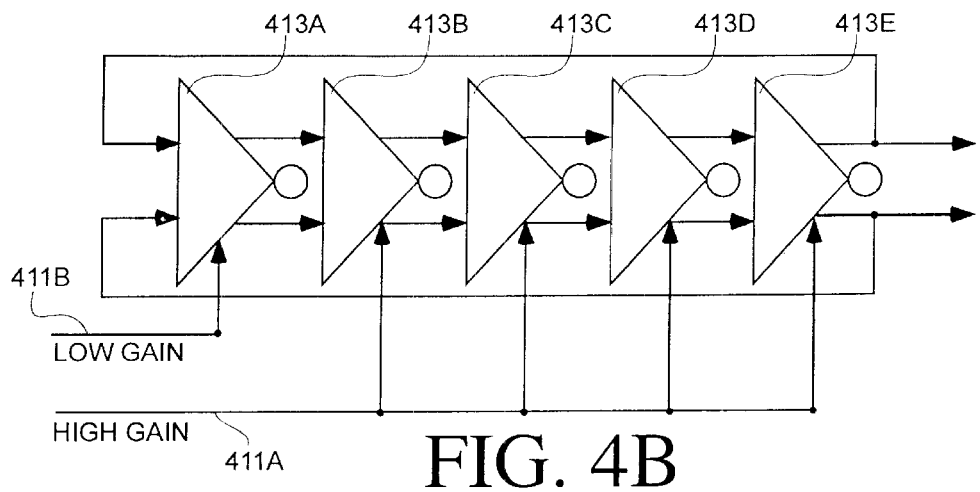
Figure 4C:
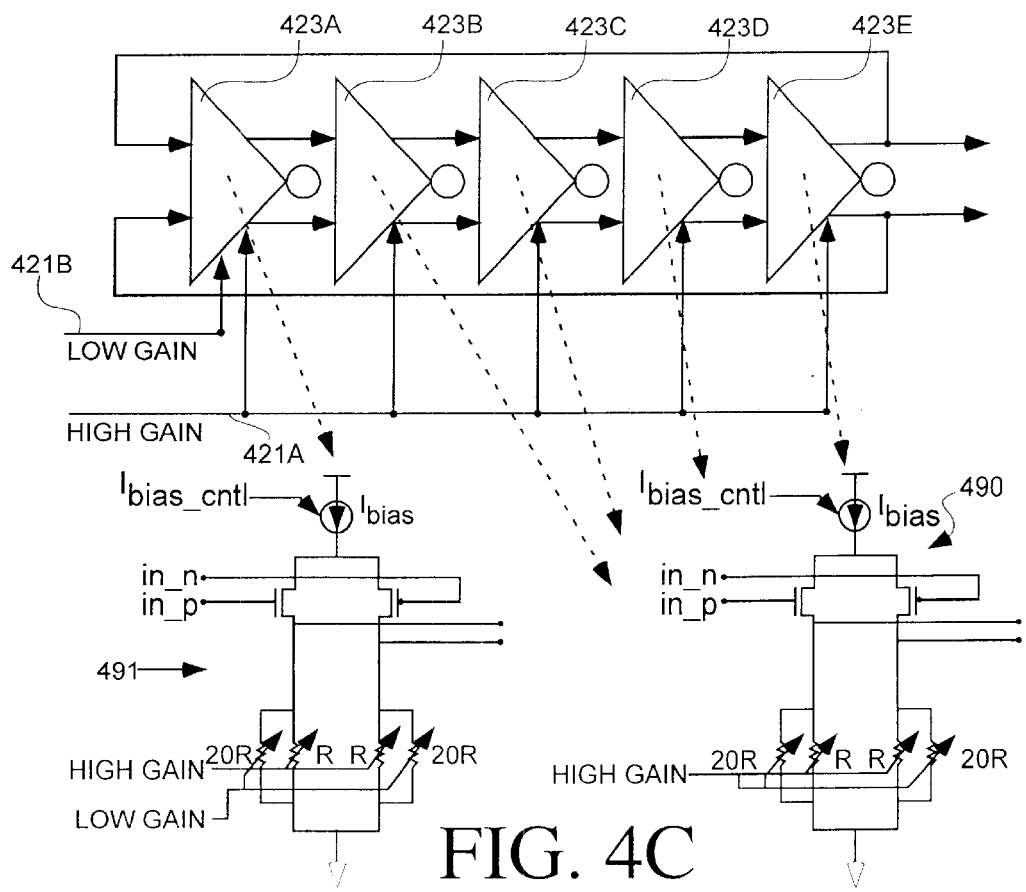

Comparing the approaches of FIGS. 4b and 4c with the approach of FIG. 4a, note that the approaches of FIGS. 4b and 4c do not couple the low gain input 411b, 421b to every inverter 413a through 413e, 423a through 423e. By coupling less than all of the inverters within the VCO to the low gain input 411b, 421b, the low gain of the VCO is reduced (as compared to the approach of FIG. 4a) in proportion to the number of inverters not coupled to the low gain input. For example, if the inverters 403a through 403e of FIG. 4a are designed identically to the inverters 423a through 423e of FIG. 4c, the VCO shown in FIG. 4c will exhibit approximately 20% of the low gain that the VCO of FIG. 4a exhibits (i.e., an 80% reduction since 4 out of 5 inverter are not coupled to the low gain input).

Coupling less than all of the inverters to the low gain input 411b, 421b even further desensitizes the VCO to jitter from the second loop filter 305b of FIG. 3a. Note that in some embodiments a plurality of inverters (rather than just one inverter) may be coupled to the low gain input 411b, 421b. For example, if 60% rather than 20% of the low gain of the VCO shown in FIG. 4a is desired, two rather than four inverters may be isolated from the low gain input. Thus, FIGS. 4a and 4b are just two examples of many possible embodiments that may exist.

Comparing FIG. 4b with FIG. 4c, note that the inverter 423a of FIG. 4c is coupled to both the low gain 421b and high gain 421a inputs while the inverter 413a of FIG. 4b is isolated from the high gain input 411a. Because the inverter 413a of FIG. 4b is isolated from the high gain input 411a, the high gain response of the VCO suffers a reduction because only 4 out of 5 inverters are coupled to the high gain input 411a. While this may be suitable in some applications, other applications may desire reduced low gain (achieved by isolating inverters from the low gain input) without sacrificing high gain response.

The approach of FIG. 4c represents such an approach since all the inverters are coupled to the high gain input 411a, yet less than all of the inverters are coupled to the low gain input 411b. Again, the number of inverters within the VCO as well as the number of inverters isolated from the low gain input 421b may vary from embodiment to embodiment in order to suit the designer's gain objectives. Furthermore, note that the inverters (and thus the VCO) may be single ended as well as differential.

Figure 5A:
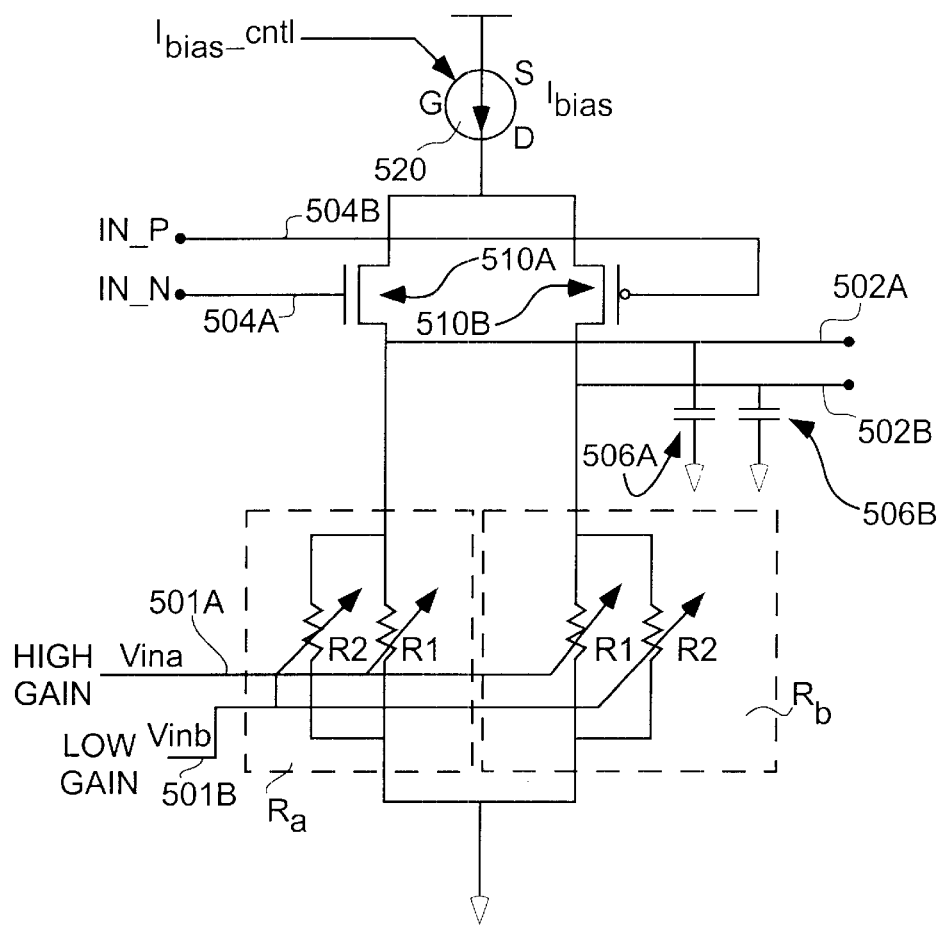
FIG. 5a shows a design embodiment that may be used to implement an inverter within the VCO architecture of FIG. 4.

FIG. 5a shows an embodiment of a design that may be used to implement each inverter block 403a,b,c,d,e of FIG. 4a. In FIG. 5a, high gain input 501a and low gain input 501b correspond respectively to the high gain inputs 301a, 401a and low gain inputs 301b, 401b of FIGS. 3 and 4. The differential inputs in_n 504a and in_p 504b respectively correspond to the differential inputs of an inverter block, such as nodes 404a,b of FIG. 4. The differential output nodes 502a,b respectively correspond to the differential output nodes of an inverter block such as nodes 402a,b of FIG. 4a.

Note the capacitive load 506a,b at each inverter output 502a,b. Capacitive load 506a,b typically results from capacitance associated with: 1) variable resistors R1, R2; 2) the input transistors within the next inverter; and 2) the interconnect lines used to connect to the next inverter. In the differential approach shown in FIG. 5a, each transistor 510a,b acts as a switch between its corresponding capacitive load 506a (for transistor 510a), 506b (for transistor 510b) and a current source 520. When a logic low is presented on a transistor, the transistor is "on" (i.e., the switch is "open") allowing current $I_{bias}$ from the current source 520 to flow into and charge up its corresponding load capacitor. When a logic high is presented on a transistor, the transistor is "off" (i.e., the switch is "closed"). This isolates the load capacitor from the current source 520 allowing the load capacitor voltage to discharge through resistors R1, R2 (which may be collectively referred to as the load resistance R). Single ended inverters may also be used.

Figure 5B:
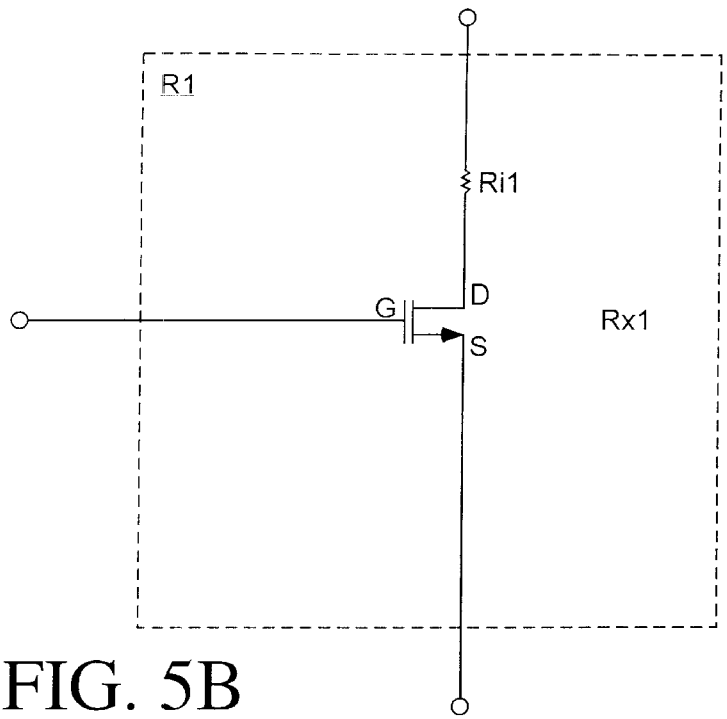
FIG. 5b shows an embodiment of a variable resistor.
Figure 5C:
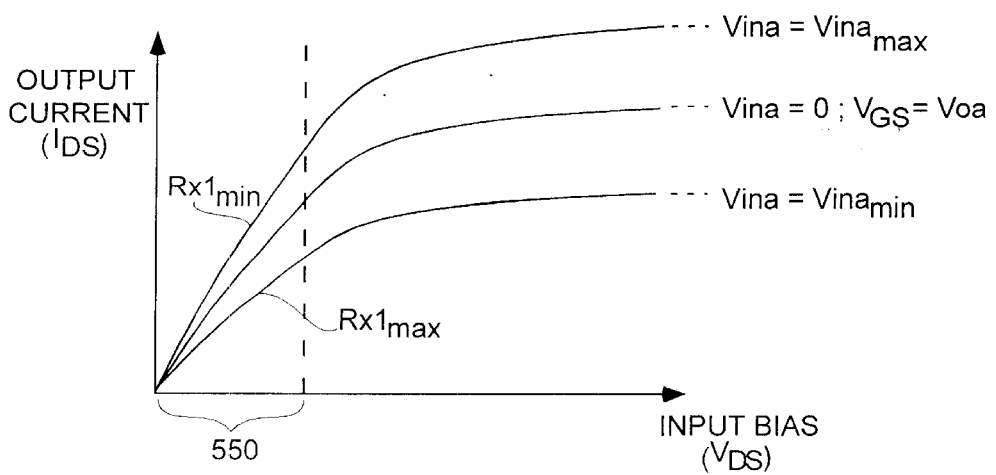
FIG. 5c shows a linear output current/input bias relationship.

Note that both R1 and R2 are variable resistors. An example of a variable resistor R1 is shown in FIG. 5b. A variable resistor (such as variable resistor R1) may be formed by placing a fixed resistor in series with a transistor; where the transistor operates in a region such that its terminal voltage (e.g., $V_{DS}$ for a field effect transistor (FET)) varies linearly with its terminal current (e.g., $I_{DS}$ for an FET) over a range of applied input biases (e.g., a range of applied $V_{GS}$ voltages for an FET). The linear range 550 of FIG. 5c corresponds to such a region for the PET transistor of FIG. 5b.

The resistance of the variable resistor R1 of FIG. 5b may be approximated as:

$$R1 \approx Ri1+Rx1=Ri1+(k1/(Vina+Voa-Vt)) \qquad \text{Eqn. 4a}$$

where: 1) Ri1 is the resistance of the fixed resistor in series with the transistor; 2) Rx1 is the resistance of the transistor; 3) Vina+Voa is the $V_{GS}$ of the transistor; 4) Vt is the threshold of the transistor; and 5) k1 is parameter relating to the dimensions and doping of the transistor. If the variable resistance R2 of FIG. 5a is also formed with a resistor in series with an n channel FET, its resistance may be similarly expressed as $$R2 \approx Ri2+Rx2=Ri2+(k2/(Vinb+Voa-Vt)) \qquad \text{Eqn. 4b}$$

Note that, with respect to FIG. 5a and Equations 4a and 4b, Vina and Vinb are the input voltages presented at the hi and low gain inputs 501a,b, respectively and Voa and Vob are reference voltages within the high gain and low gain input voltage ranges, respectively. In alternate embodiments, p channel transistors may be used and/or the fixed resistance may be eliminated.

Referring briefly to equations 3, 4a and 4b, Ri1 and Ri2 may be used to set the center frequency fco of the VCO while Rx1 and Rx2 may be used to set the VCO's high gain A and low gain B parameters, respectively. The delay through the inverter is determined by the value of the load capacitors 506a,b, the value of $I_{bias}$, and the value of the load resistances Ra,b. Each load resistance Ra,b is equivalent to the combined resistive effect of load resistors R1 and R2 (thus Ra and Rb may be expressed as R=(R1·R2)/(R1+R2)). Note that in FIG. 5a, each load resistance Ra,b shunts its corresponding capacitive load 506a,b. The voltage on the load capacitors 506a,b will "ramp up" faster as the designer increases the current $I_{bias}$. Also, the voltage on the load capacitors 506a,b will decay faster as the designer reduces the time constant of the load capacitor and the load resistance (where the time constant may be expressed as $C_{load}·R$).

A load capacitor (e.g., capacitor 506a) shunted with a load resistance R may be viewed as an impedance expressed as $R/(1+j2\pi fRC_{load})$. Note that the impedance has a pole at $1/RC_{load}$. As the position of the pole moves to higher and higher frequencies, the oscillation frequency of the VCO increases. Thus, as R and $C_{load}$ decrease, the frequency of the VCO increases. Various other embodiments may have other combinations of circuit elements (e.g., resistance, capacitance, inductance) that correspond to a different impedance expression than that above. Note, however, that the frequency of the VCO may be increased by increasing the frequency of the pole(s) (or zero(s)) within the impedance expression.

In summary then, the frequency of the oscillator is proportional to $I_{bias}$ but inversely proportional to $C_{load}$ and R for the inverter embodiment of FIG. 5a. Because a higher oscillator frequency corresponds to a higher VCO gain, and because the frequency of the oscillator increases as the load resistance decreases; in order to implement a high gain input and a low gain input to the VCO, the percentage change in the load resistance R should be lower, as a result of variation in resistor R2 (which is used to adjust the low gain), than the percentage change that results from the same amount of variation in resistor R1(which is used to adjust the high gain).

This may be accomplished in a number of ways, for example, if R2 is greater than R1 and both resistances vary approximately the same amount. An example of such a case includes, from analysis of equations 4a and 4b, if Ri2 is greater than Ri1 (e.g., Ri2=20 ohms and Ri1=5 ohms) and k1 is approximately the same as k2. Other ways, such as if R2 is greater than (or approximately the same as) R1 but R1 has greater variation than R2 are also possible or if R1 is greater than R2 provided R1 varies a sufficiently greater amount than R2.

Referring back to FIG. 4c, note that the inverters 423b through 423e (having no effective low gain input 421a) may be implemented with an inverter structure 490 that couples the high gain input to the low gain input. That is, R (which is equal to (R1·R2)/(R1+R2)) begins to approximate R1 (the high gain resistor) as R2 becomes greater than R1. In other embodiments the low gain resistor R2 may be removed. The inverter structure 491 used for the inverter 423a having both inputs may be implemented as seen in FIG. 5a. The inverters 413b through 413e of the VCO of FIG. 4b may be designed similar to the inverters 423b through 423e of FIG. 4c. Inverter 413a of FIG. 4b may simply remove the high gain resistor (R1).

Note that in variable resistor embodiments that employ a transistor configured to have a terminal voltage behave linearly with a terminal current, in order to translate between a loop filter output and the proper transistor input bias, level shifting (such as imposing one or more diode drops) or comparable functions may be provided between the transistor input and the loop filter output.

Recall that the inverter's delay is inversely proportional to the bias current $I_{bias}$. This means inverter delay decreases (corresponding to a VCO output frequency increase) as $I_{bias}$ increases; and, inverter delay increases (corresponding to a VCO output frequency decrease) as $I_{bias}$ decreases. In order to enhance the gain of the VCO, $I_{bias}$ may be modulated with a VCO input voltage (e.g., $V_{in}$a). Specifically, $I_{bias}$ can be configured to increase when a change in input voltage corresponds to an increase in VCO output frequency; and/or $I_{bias}$ can be configured to decrease when a change in input voltage corresponds to a decrease in VCO output frequency.

Referring to FIG. 5a, note control signal $I_{bias}$_cntl is used to control the amount of bias current $I_{bias}$. In an embodiment, the $I_{bias}$_cntl signal is part of a current mirror circuit that includes the $I_{bias}$ current source 520. In a current mirror circuit, a current in one current path leg (the controlling leg) is used to control the current in another current path leg (the controlled leg). In FIG. 5a, the current path beneath current source 520 (which includes both R1, R2 resistances and both capacitive loads 506a,b) is the controlled leg.

Figure 6:
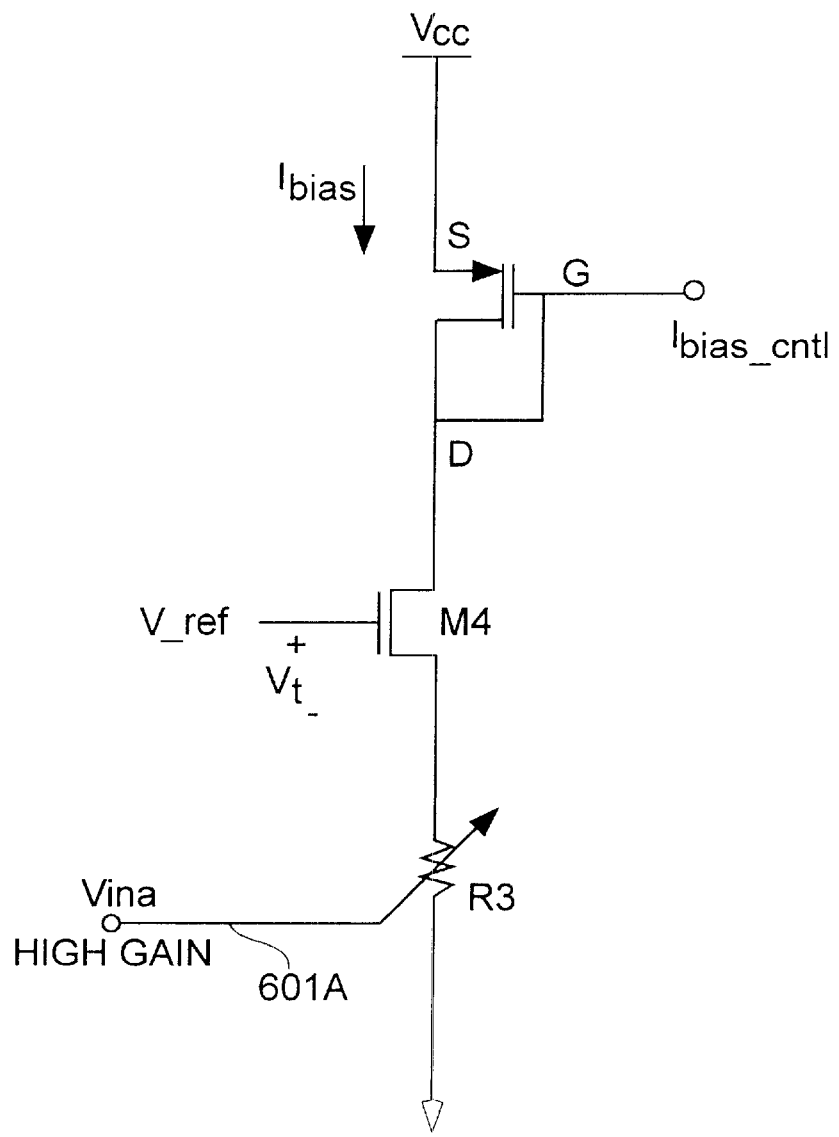
FIG. 6 shows the controlling leg of a current mirror that may be used to modulate the Ibias current of FIG. 5.

FIG. 6 shows an embodiment of a circuit that may be used for the controlling leg. In this embodiment, $I_{bias}$ of FIG. 6 is implemented with a single p-channel transistor where current flows from source S to drain D and the gate G of the transistor is coupled to $I_{bias}$_cntl (diode connected). The voltage of the $I_{bias}$_cntl net varies as a function of the current pulled by transistor M4. Referring back to FIG. 5a, the voltage on the $I_{bias}$_cntl net may be tied to the gate G of another p-channel transistor used to implement the current source 520 in FIG. 5a. For current mirrors having a 1:1 ratio, p channel transistors may be configured identically. For ratios other than 1:1 the transistors may posses different sizes and corresponding gains. More elaborate current mirror designs are also possible including those that use n channel rather than p channel devices.

Referring back to FIG. 6, note the variable resistor R3 is modulated by the $V_{ina}$ voltage. In this embodiment, an n channel FET is used to implement the variable resistor; thus as $V_{ina}$ increases, R3 decreases (and as $V_{ina}$ decreases R3 increases). With this configuration, as $V_{ina}$ increases, M4 pulls more current (since the voltage on the source of M4 is damped at Vref−Vt where Vt is the threshold voltage of transistor M4) and as $V_{ina}$ decreases, M4 pulls less current.

With the mirror implementation as discussed above, this causes $I_{bias}$ in FIG. 5a to increase with increasing $V_{ina}$ (causing an increase in VCO frequency) and decrease with decreasing $V_{ina}$ (causing a decrease in VCO frequency). Note that since the variable resistor R3 of FIG. 6 is coupled to the high gain 601a input, the modulation of $I_{bias}$ only enhances the gain of the VCO at the high gain input. This supports a wider range of available VCO output frequencies (as compared to other embodiments that do not modulate $I_{bias}$). Other embodiments may better suit their particular application by modulating $I_{bias}$ with both inputs $V_{ina}$, $V_{inb}$ or only the low gain input voltage $V_{inb}$.

Figure 7:
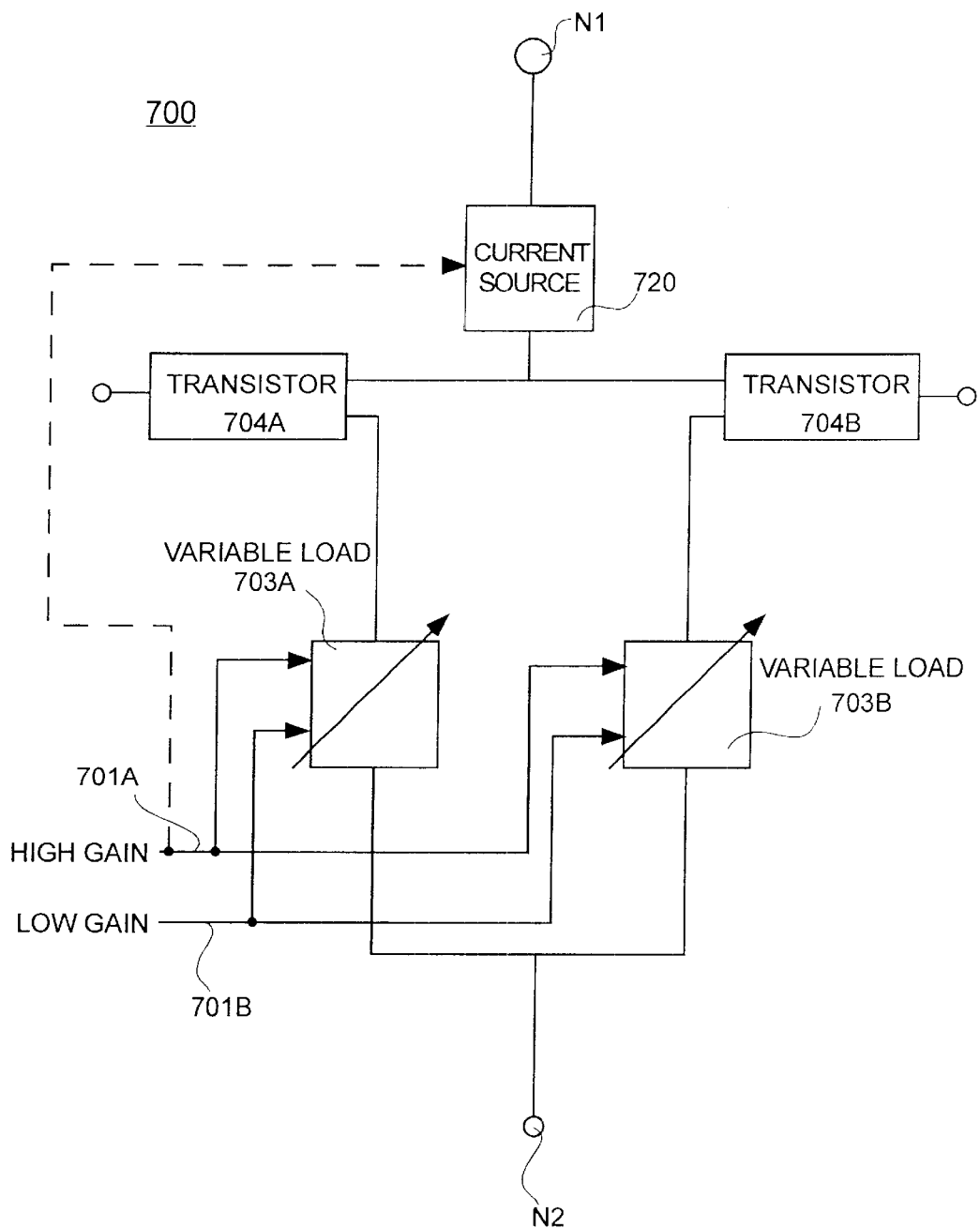
FIG. 7 shows a generic design embodiment that may be used to implement an inverter within the VCO architecture of FIG. 4.

FIG. 7 shows the VCO inverter approach discussed so far at a high level. A differential amplifier 700 is shown having a current source 720 coupled to a pair of transistors 704a,b. The pair of transistors 704a,b are coupled to a variable load 703a,b that is controlled by the high gain and low gain inputs 701a,b. A variable load 703a,b includes one or more circuit elements such as a capacitor (e.g., capacitor 502a of FIG. 5a for variable load 703a), a resistor (e.g., Ra of FIG. 5a for variable load 703a), inductor etc. that can change its value (e.g., capacitance, resistance, inductance, etc.) in response to the high gain 701a and/or low gain 701b inputs. The high gain input 701a has a greater effect on the value of the impedance of the variable load 704a,b than the low gain input 701b, resulting in greater change in delay with variation of the signal at input 701a than the signal at input 701b. For example, variation of the signal at the high gain input 701a corresponds to greater variation in the position of a pole (associated with an expression for the impedance of the variable load) than the variation that results from a signal at the low gain input 701b.

Note that FIG. 7 can be used to describe embodiments implemented differently than the particular approaches described with respect to FIGS. 5 and 6. For example, in order to control the delay through the amplifier, variable load 704a,b may include a variable capacitor (e.g., a reverse biased diode where the reverse bias voltage controls diode capacitance via control of a depletion region within the reverse biased diode) and/or variable resistors. Furthermore, the pair of transistors 704a,b may be implemented with CMOS or other forms of FETs (either n channel or p channel) or bipolar transistors.

At the option of the designer, current source 720 may be designed to be constant or may be designed to vary with an input (such the high gain input 701a as shown in FIG. 7). In embodiments choosing to vary current source 720, the current produced by current source 720 may be controlled through a current mirror configuration where an input (such as high gain input 701*a*) determines the current flow in a controlling leg and current source 720 is the controlled leg. Note also that the VCO approaches discussed herein may be used regardless if the loop filter components are "off chip" or "on chip".

PLL Implementations

Figure 8:
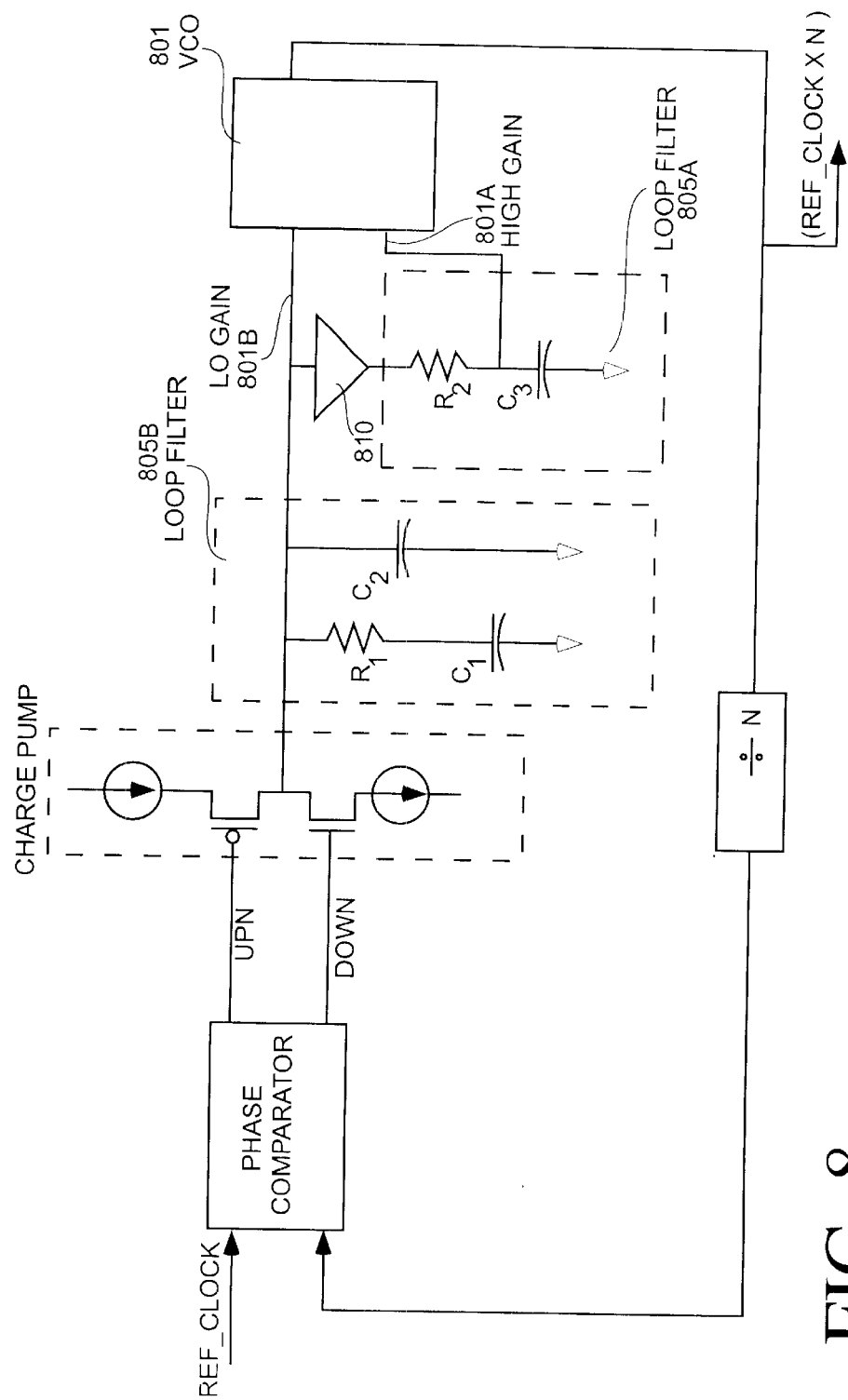

FIG. 8 shows a PLL implementation using a VCO 801 having a high gain input 801*a* and a low gain 801*b* input. Two loop filters 805*a,b* exist in order to implement the two channels as discussed with respect to FIG. 3*a*. Consistent with the discussion of FIG. 3*a*, the high gain input 801*a* is coupled to a first loop filter 805*a* and the low gain input 801*b* is responsive to a second loop filter 805*b*. The first loop filter 805*a* is designed with a lower bandwidth than the second loop filter 805*b* (e.g., filter 805*a* exhibits more supression of the reference clock fo than filter 805*b*). Thus, the pole produced by the combination of R2 and C3 is lower in frequency than the zero produced by R1 and C1.

The combination of a high gain VCO input 801*a* coupled to the first loop filter 805*a* (i.e., a high gain channel) and a low gain VCO input coupled to the second loop filter 805*b* (i.e., a low gain channel) results in the high gain channel initially positioning the VCO frequency from an inaccurate position to a more accurate position that is proximate to the correct frequency. As the VCO frequency becomes more accurate, the current pulses from the charge pump 804 become narrower. This keeps the voltage variation from the high gain input 801*a* minimal (since relatively lower signal power exists at low frequencies with narrow pulses) and the low gain channel begins to noticeably affect the VCO output frequency (since relatively more signal power is found at higher frequencies) until the proper VCO frequency is reached.

Isolation 810 is used to isolate loop filter 805*b* from loop filter 805*a*. Isolation helps keep the operation of loop filter 805*b* unaffected by the operation of loop filter 805*a*. In one embodiment, a transconductance amplifier is used for isolation 810. Note again that the implementation shown in FIG. 8 can be used regardless if the filter components are "off chip" or "on chip".

Figure 9:
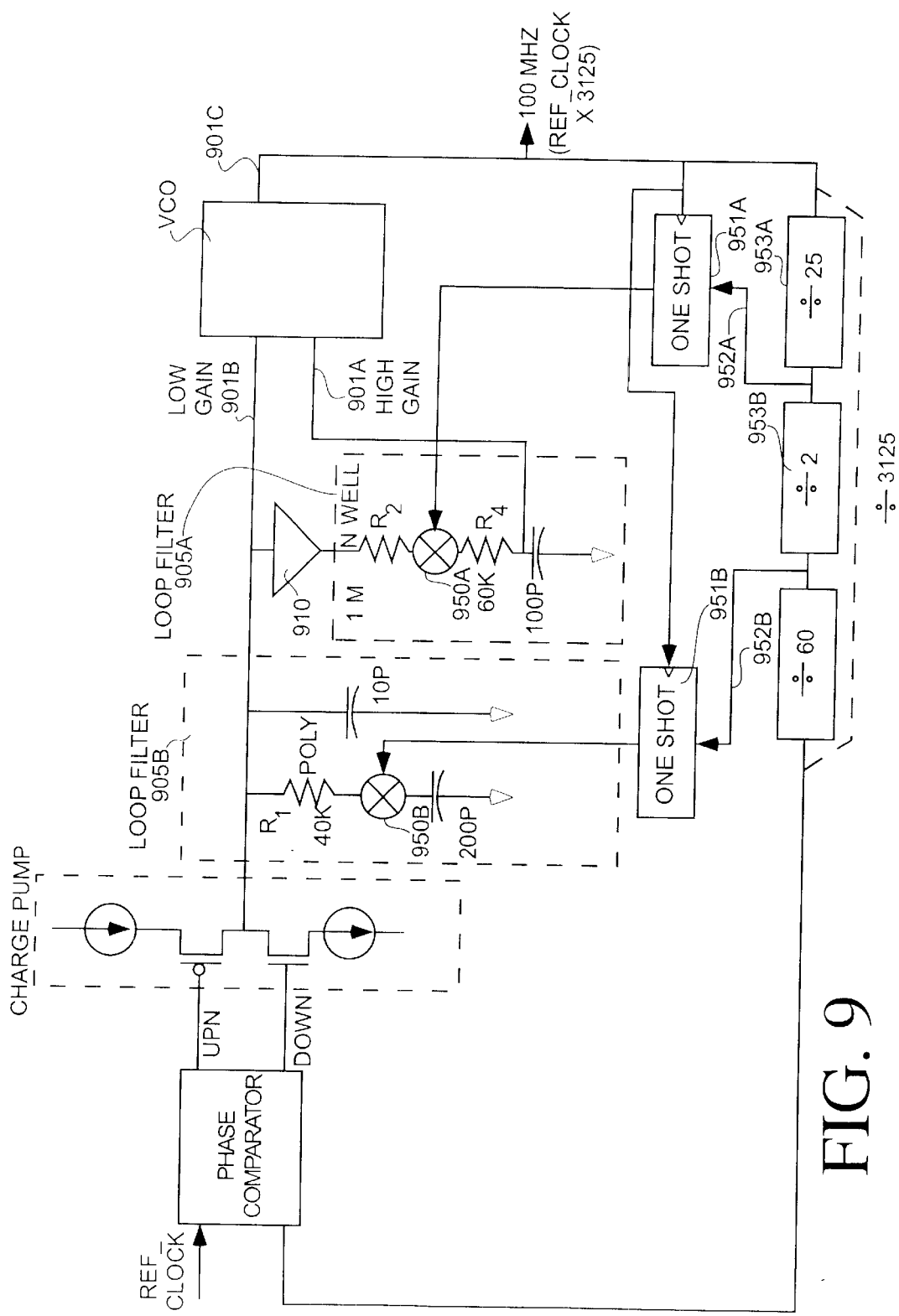

FIG. 9 shows an implementation suited for applications desiring all loop filter components to be "on chip". FIG. 9 may be viewed as the implementation of FIG. 8 where the loop filter resistors R1 and R2 are enhanced by the techniques discussed with respect to FIG. 2. Thus, as shown in FIG. 9, filter resistors R2, R1 are implemented in series with switches 950*a,b*.

Switches 950*a,b* are each coupled to "one shot" logic 951*a,b* that controls the modulation of the switch at a duty cycle. Each one shot logic 951*a,b* element supplies one pulse from the VCO output 901*c* at the proper instance of time indicated by the downconverter taps 952*a,b*. For example, if the VCO output frequency is 100 MHz, downconverter tap 952*a* produces a 4 Mhz clock (100/25=4) and downconverter tap 952*b* produces a 2 MHz clock (4/2=2). For a particular switch 950*a,b*, one shot 951*a,b* and the portion of the downconverter 953*a,b* that produces a tap 952*a,b* correspond to the duty cycle circuit 207 of FIG. 2.

One shot 951*a* is therefore configured to send one 10 ns pulse every 250 ns and one shot 951*b* is configured to send one 10 ns pulse every 500 ns. This corresponds to a duty cycle of 1:25 during which switch 950*a* is closed and a duty cycle of 1:50 during which switch 951*b* is closed. As such, R1 is effectively increased by a factor of 50.0 and R2 is effectively increased by a factor of 25.0.

In the example of FIG. 9, R1 is a 40 k resistor that is effectively enhanced by the modulation of switch 950*b* to 2M (40 k×50=2M) and R2 is a 1M resistor that is effectively enhanced by the modulation of switch 950*a* to 25M (1M× 25=25M). As such, the combination of the 2M effective resistance for R1 with a 200 pf capacitor for C1 produce a zero at 400 Hz and the combination of a 25M effective resistance for R2 with a 100 pf capacitor produce a pole at 60 Hz. Note again that the operational frequency associated with loop filter 905*b* (400 Hz and higher) is greater than the operational frequency of loop filter 905*a* (60 Hz or lower).

Note that given the disparity in resistance between R1 and R2 (40 k and 1M), the resistors R1 and R2 are implemented, in this example, with different materials. That is, R1 is implemented as a polysilicon resistor while R2 is implemented as an n type diffused resistor (to reduce silicon surface area consumption). N type diffused resistors are known to leak through the n-well (in an n-well technology process). Isolation 910 provides this leakage current without loading node 901*b*.

Note also the additional 60 k resistor R4. Since loop filter 905*a* is coupled to the high gain input 901*a* of the VCO, the PLL may be sensitive to noise from loop filter 905*a*. Since switch 950*a* may produce switching noise in loop filter 905*a*, R4 is used to introduce another pole within the high gain channel. Thus, the high gain input is sampled after the signal passes through R4. Thus loop filter 905*a* may be viewed as having a filter that corresponds to the operation of the VCO (e.g., a pole produced by the effective resistance of R2 and C3) and a filter used to reduce switching noise from the switch 950*a* (e.g., a pole produced by the effective resistance of R4 and C3).

Depending on the particular VCO gains and resistor values/technologies employed, filtering of the switch noise may or may not be useful in either loop filter 905*a,b*. For the particular embodiment of FIG. 9, the VCO high gain ("A" in Equation 3 was 260 Mhz/volt) while the low gain ("B" in Equation 3 was 13 MHz/volt). Note that different filter component values and VCO gains may be used depending on the designer's particular application.

Note also that embodiments of this invention may be implemented not only within a semiconductor chip but also within machine readable media. For example, these designs may be stored upon and/or embedded within machine readable media associated with a software design tool used for designing semiconductor devices. Examples include architectural level descriptions (e.g., a VHSIC Hardware Description Language (VHDL) netlist), gate level descriptions (e.g., a Verilog Register Transfer Level (RTL) netlist), and transistor level descriptions (e.g., a SPICE or SPICE related netlist). Note that such descriptions may be synthesized as well as synthesizable. Machine readable media also includes media having layout information such as a GDS-II file. Furthermore, netlist files or other machine readable media for semiconductor chip design may be used in a simulation environment to perform any methods of the designs described above.

Thus, it is also to be understood that embodiments of this invention may be used as or to support software programs executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of operation for a phase locked loop circuit, said method comprising:

a) presenting a high gain signal and a low gain signal to an inverter load, said inverter being part of a voltage controlled oscillator, said voltage controlled oscillator being part of said phase locked loop circuit, said inverter having a delay that increases as an RC time constant of said inverter load increases;

b) changing RC time constant in response to said high gain signal; and c) changing RC time constant in response to said low gain signal, said changing of said RC time constant in response to said high gain signal causing a greater change to said RC time constant than said changing of said RC time constant in response to said low gain signal causes.

2. The method of claim 1 wherein said changing said RC time constant in response to said high gain signal further comprises changing the resistance of a variable resistor, said variable resistor being part of said inverter load.

3. A voltage controlled oscillator having a high gain input and a low gain input, said voltage controlled oscillator comprising:

a series of inverters arranged in a ring, each inverter output being coupled to a next inverter input in said series, each of said inverters having an RC time constant that controls its output delay, a first of said inverters having a first RC time constant that is at least partially controlled at said high gain input, a second of said inverters having a second RC time constant that is at least partially controlled at said low gain input, said high gain input to receive a first signal and said low gain input to receive a second signal, said first signal causing a greater change to said first RC time constant than said first signal would cause to said second RC time constant if applied to said low gain input, and, less than all of said inverters having their RC time constant at least partially controlled at said low gain input.

4. The voltage controlled oscillator of claim 3 wherein less than all of said inverters have their RC time constant at least partially controlled at both said low gain input and said high gain input.

5. The voltage controlled oscillator of claim 3 wherein at least one of said inverters has its RC constant controlled from said high gain input and said low gain input.

6. The voltage controlled oscillator of claim 3 wherein a n increase in a voltage of said first signal causes said output delay to decrease.

7. The voltage controlled oscillator of claim 3 wherein at least one of said inverters further comprises:

a) a first load resistance coupled to a first transistor, said first load resistance comprising a first variable resistor that is in parallel with a second variable resistor;

b) a second load resistance coupled to a second transistor, said second load resistance comprising a third variable resistor that is in parallel with a fourth variable resistor; and c) said high gain input coupled to said first and third variable resistors and said low gain input coupled to said second and fourth variable resistors, wherein said first signal being applied to said high gain input causes a greater change in said first and second load resistances than first said signal would cause if applied to said low gain input.

8. The voltage controlled oscillator of claim 7 wherein said first variable resistor has a first resistance and said second variable resistor has a second resistance, said first resistance being less than said second resistance.

9. The voltage controlled oscillator of claim 7 further comprising a current source coupled to said first and second transistors.

10. The voltage controlled oscillator of claim 9 wherein high gain input is coupled to a controlling leg of a current mirror, said controlling leg coupled to said current source.

11. A phase locked loop circuit, said phase locked loop circuit further comprising voltage controlled oscillator, said voltage controlled oscillator further comprising a high gain input and a low gain input, said voltage controlled oscillator further comprising:

a series of inverters arranged in a ring, each inverter ouput being coupled to a next inverter input in said series, each of said inverters having an RC time constant that controls its output delay, a first said inverters having a first RC time constant that is at least partially controlled at said high gain input, a second of said inverters having a second RC time constant that is a least partially controlled at said low gain input, said high gain input to receive a first signal and said low gain input to receive a second signal, said first signal cuasing a greater changed to said first RC time constant than said first signal would cause to said second RC time constant if applied to said low gain input, and, less than all of said inverters having their RC time constant at least partially controlled at said low gain input.

12. The phase locked loop circuit of claim 11 wherein less than all of said inverters have their RC time constant at least partially controlled at said high gain input.

13. The phase locked loop circuit of claim 11 wherein one of said inverters has its RC time constant controlled from said high gain input and said low gain input.

14. The phase locked loop circuit of claim 13 wherein an increase in a voltage of said first signal causes said output delay to decrease.

15. The phase locked loop circuit of claim 11 wherein at least one of said inverters further comprises:

a) a first load resistance coupled to a first transistor, said first load resistance comprising a first variable resistor that is in parallel with a second variable resistor;

b) a second load resistance coupled to a second transistor, said second load resistance comprising a third variable resistor that is in parallel with a fourth variable resistor; and c) said high gain input coupled to said first and third variable resistors and said low gain input coupled to said second and fourth variable resistors, wherein said first signal being applied to said high gain input causes a greater change in said first and second load resistances than first said signal would cause if applied to said low gain input.

16. The phase locked loop circuit of claim 15 wherein said first variable resistor has a first resistance and said second variable resistor has a second resistance, said first resistance being less than said second resistance.

17. The phase locked loop circuit of claim 15 further comprising a current source coupled to said first and second transistors.

18. The phase locked loop circuit of claim 17 wherein said high gain input is coupled to a controlling leg of a current mirror, said controlling leg coupled to said current source.

19. The phase locked loop circuit of claim 11 further comprising a first filter, said first filter having an output coupled to one of said inputs.

20. The phase locked loop circuit of claim 19 further comprising a second filter, said second filter having an output coupled to the other of said inputs.

21. The phase locked loop circuit of claim 20 wherein said first filter output is coupled to said high gain input and said second filter output is coupled to said low gain input, said second filter having a greater bandwidth than said first filter.

22. The phase locked loop circuit of claim 11 further comprising:
   a) an chip loop filter coupled to said voltage controlled oscillator, said voltage controlled oscillator being on chip, said on chip loop filter having each of its resistor and capacitor components on chip, one of said components being an on chip resistor; and
   b) an on chip switch that is modulated at a duty cycle in order to increase the resistance of a current path that flows through said on chip resistor, said on chip switch placed along said current path.

23. A machine readable medium formatted to be interpreted as voltage controlled oscillator having a high gain input and a low gain input, said voltage controlled oscillator comprising:
   a series of inverters arranged in a ring, each inverter output being coupled to a next inverter input in said series, each of said inverters having an RC time constant that controls its output delay, a first said inverters having a first RC time constant that is at least partially controlled at said high gain input, a second of said inverters having a second RC time constant that is at least partially controlled at said low gain input, said high gain input to receive a first signal and said low gain input to receive a second signal, said first signal causing a greater change to said first RC time constant than said first signal would cause to said second RC time constant if applied to said low gain input, and, less than all of said inverters having their RC time constant at least partially controlled at said low gain input.

24. The machine readable medium of claim 23 wherein less than all of said inverters have their RC time constant at least partially controlled at said high gain input.

25. The machine readable medium of claim 23 wherein one of said inverters has its RC time constant controlled from said high gain input and said low gain input.

26. The machine readable medium of claim 23 wherein an increase in a voltage of said signal causes said output delay to decrease.

27. The machine readable medium of claim 23 wherein at least one of said inverters further comprises:
   a) a first load resistance coupled to a first transistor, said first load resistance comprising a first variable resistor that is in parallel with a second variable resistor;
   b) a second load resistance coupled to a second transistor, said second load resistance comprising a third variable resistor that is in parallel with a fourth variable resistor; and
   c) said high gain input coupled to said first and third variable resistors and said low gain input coupled to said second and fourth variable resistors, wherein said first signal being applied to said high gain input causes a greater change in said first and second load resistances than first signal would cause if applied to said low gain input.

28. The machine readable medium of claim 27 wherein said first variable resistor has a first resistance and said second variable resistor has a second resistance, said first resistance being less than said second resistance.

29. The machine readable medium of claim 27 further comprising a current source coupled to said first and second transistors.

30. The machine readable medium of claim 29 wherein high gain input is coupled to a controlling leg of a current mirror, said controlling leg coupled to said current source.

31. A machine readable medium formatted to be interpreted as a phase locked loop circuit, said phase locked loop circuit further comprising a voltage controlled oscillator, said voltage controlled oscillator further comprising a high gain input and a low gain input, said voltage controlled oscillator further comprising:
   a series of inverters arranged in a ring, each inverter output being coupled to a next inverter input in said series, each of said inverters having an RC time constant that controls its output delay, a first of said inverters having a first RC time constant that is at least partially controlled at said high gain input, a second of said inverters having a second RC time constant that is at least partially controlled at said low gain input, said high gain input to receive a first signal and said low gain input to receive a second signal, said first signal causing a greater change to said first RC time constant than said first signal would cause to said second RC time constant if applied to said low gain input, and, less than all of said inverters having their RC time constant at least partially controlled at said low gain input.

32. The machine readable medium of claim 31 wherein less than all of said inverters have their RC time constant at least partially controlled at said high gain input.

33. The machine readable medium of claim 31 wherein one of said inverters has its RC time constant controlled from said high gain input and said low gain input.

34. The machine readable medium of claim 33 wherein an increase in a voltage of said first signal causes said output delay to decrease.

35. The machine readable medium of claim 31 wherein at least one of said inverters further comprises:
   a) a first load resistance coupled to a first transistor, said first load resistance comprising a first variable resistor that is in parallel with a second variable resistor;
   b) a second load resistance coupled to a second transistor, said second load resistance comprising a third variable resistor that is in parallel with a fourth variable resistor; and
   c) said high gain input coupled to said first and third variable resistors and said low gain input coupled to said second and fourth variable resistors, wherein said first signal being applied to said high gain input causes a greater change in said first and second load resistances than first said signal would cause if applied to said low gain input.

36. The machine readable medium of claim 35 wherein said first variable resistor has a first resistance and said second variable resistor has a second resistance, said first resistance being less than said second resistance.

37. The machine readable medium of calim 35 further comprising a current source coupled to said first and second transistors.

38. The machine readable meidum of claim 37 wherein said high gain input is coupled to a controlling leg of a current mirror, said controlling leg coupled to said current source.

39. The machine readable medium of claim 31 further comprising a first filter, said first filter having an output coupled to one of said inputs.

40. The machine readable medium of claim 39 further comprising a second filter, said second filter having an output coupled to the other of said inputs.

41. The machine readable medium of claim 40 wherein said first filter output is coupled to said high gain input and said second filter output is coupled to said low gain input, said second filter having a greater bandwidth than said first filter.

42. The machine readable medium of claim 31 further comprising:
   a) an chip loop filter coupled to said voltage controlled oscillator, said voltage controlled oscillator being on chip, said on chip loop filter having each of its resistor and capacitor components on chip, one of said components being an on chip resistor; and
   b) an on chip switch that is modulated at a duty cycle in order to increase the resistance of a current path that flows through said on chip resistor, said on chip switch placed along said current path.

43. A voltage controlled oscillator having a high gain input and a low gain input, said voltage controlled oscillator comprising:
   a series of delay stages arranged in a ring, each delay stage output being coupled to a next delay stage input in said series, each of said delay stages having an RC time constant that controls its delay, one of said delay stages having an RC time constant that is controlled at said high gain input and said low gain input, said high gain input to receive a first signal and said low gain input to receive a second signal, said first signal causing a greater change to said RC time constant than said first signal would cause to said RC time constant if applied to said low gain input.

44. The voltage controlled oscillator of claim 43 wherein an increase in a voltage of said first signal causes said delay to decrease.

45. The voltage controlled oscillator of claim 43 wherein said delay stage further comprises:
   a) a first load resistance coupled to a first transistor, said first load resistance comprising a first variable resistor that is in parallel with a second variable resistor;
   b) a second load resistance coupled to a second transistor, said second load resistance comprising a third variable resistor that is in parallel with a fourth variable resistor; and
   c) said high gain input couple to said first and third variable resistors and said low gain input coupled to said second and fourth variable resistors, wherein said first signal being applied to said high gain input causes a greater change in said first and second load resistances than first said signal would cause if applied to said low gain input.

46. The voltage controlled oscillator of claim 45 wherein said first variable resistor has a first resistance and said second variable resistor has a second resistance, said first resistance being less than said second resistance.

47. A phase locked loop circuit, said phase locked loop circuit further comprising voltage controlled oscillator, said voltage controlled oscillator further comprising a high gain input and a low gain input, said voltage controlled oscillator further comprising:
   a series of delay stages arranged in a ring, each delay stage output being coupled to a next delay stage input in said series, each of said delay stages having an RC time constant that controls its delay, one of said delay stage s having an RC time constant that is controlled at said high gain input and said low gain input, said high gain input to receive a first signal and said low gain input to receive a second signal, said first signal causing a greater change to said RC time constant than said first signal would cause to said RC time constant if applied to said low gain input.

* * * * *